United States Patent [19]
Jen et al.

[11] Patent Number: 5,960,295
[45] Date of Patent: Sep. 28, 1999

[54] METHOD FOR FABRICATING A STORAGE PLATE OF A SEMICONDUCTOR CAPACITOR

[75] Inventors: Tean-Sen Jen, Chiayih; Shiou-Yu Wang, Taipei; Jia-Shyong Cheng, Hsinchu Hsien, all of Taiwan

[73] Assignee: Nan Ya Technology Corporation, Taiwan

[21] Appl. No.: 09/009,160

[22] Filed: Jan. 20, 1998

[30] Foreign Application Priority Data

Sep. 24, 1997 [TW] Taiwan ................................. 86113872

[51] Int. Cl.⁶ .................................................. H01L 21/20
[52] U.S. Cl. ........................................... 438/398; 438/255
[58] Field of Search ................................ 438/253, 255, 438/398, 396

[56] References Cited

U.S. PATENT DOCUMENTS 5,427,974   6/1995   Lur et al. .............................. 438/398
5,817,554  10/1998   Tseng .................................... 438/255

*Primary Examiner*—Tuan H. Nguyen
*Attorney, Agent, or Firm*—Michael D. Bednarek; Crowell & Moring LLP

[57] ABSTRACT

The present invention provides a method for fabricating a storage plate of a semiconductor capacitor. A conductive layer is first formed on a semiconductor substrate. A glue layer is formed on the conductive layer. A plurality of micro masking-balls are then spread onto the surface of the glue layer. Using these micro masking-balls as masks, the glue layer is etched to expose a portion surface of the conductive layer. Using the remaining glue layer as a mask, the conductive layer is etched to form a bristle-shaped conductive layer. After that, the glue layer and micro masking-balls are removed, thereby allowing the remaining bristle-shaped conductive layer to form a storage plate of a semiconductor capacitor.

22 Claims, 8 Drawing Sheets

METHOD FOR FABRICATING A STORAGE PLATE OF A SEMICONDUCTOR CAPACITOR

BACKGROUND OF THE INVENTION

1. Field of the Invention

This invention relates in general to the field of fabricating semiconductor memory devices, and more particularly to a method for fabricating a storage plate of a capacitor suitable for a semiconductor memory device.

2. Description of Related Art

A capacitor is a widely used electrical component. In the present semiconductor integrated circuit industry, a capacitor plays an indispensable role in the field of semiconductor circuit design. The capacitor can be utilized in many kinds of electrical devices, such as dynamic random access memory (DRAM), oscillators, time-delay circuits, AD/DA converters, and other applications. Basically, a dielectric layer sandwiched between two conductive layers (i.e. storage plate) constitutes a capacitor. The capability of charge storage in a capacitor is determined by the following three physical parameters: (1) the thickness of the dielectric layer; (2) the surface area of the storage plate; and (3) the electrical or mechanical properties of the dielectric layer and the storage plate.

An example can be found in today's DRAM cell, which includes a transistor and a capacitor for storing data charge. In order to improve the integration density of a DRAM device, the size of each memory cell is continuously being shrunk. As known by those skilled in this art, the capacitor should have enough capacity to avoid data loss. Therefore, many attempts have been bade to maintain sufficient surface area of the storage plate in the capacitor, even the horizontal area of a memory cell is decreased.

Highly integrated DRAM requires three-dimensional capacitor structure such as that of a stack-type capacitor. For example, a "bristle-shaped" capacitor structure has been developed to form a capacitor with rugged storage plate surface above the transistor. This structure can achieve the advantages of low soft error rate and high capacitance if a suitable dielectric layer with high dielectric constant is used. The fabricating processes for three-dimensional capacitors, however, are more complicated than other conventional techniques. This results in increased manufacturing cost.

R.O.C. patent No. 239,234 discloses a method of fabricating a bristle-shaped storage plate of a semiconductor capacitor. The processing steps of this prior art are now described in detail, with reference to FIGS. 1 to 4. First, as shown in FIG. 1, a silicon wafer is subjected to a conventional process for forming a field oxide and a transistor consisting of gate, source and drain regions (not shown). To simplify the drawing, a substrate 20 with uniform surface is used to depict the above configuration.

Next, appropriate processing steps are performed to form a storage plate of a capacitor on the substrate 20. A silicon dioxide layer 23 is formed on the substrate 20 by chemical vapor deposition (CVD). The silicon dioxide layer 23 is then etched to form a contact window. A polysilicon layer 24 is formed on the silicon dioxide layer 23 by a CVD process and connected to one of the source and drain regions of the transistor through the contact window. Another silicon dioxide layer 31 and polysilicon layer 32 are successively deposited on the polysilicon layer 24.

An aluminum layer 33 is deposited on the surface of the polysilicon layer 32. The entire substrate is then annealed at a temperature between 400° C. to 577° C. The aluminum layer 33 and the polysilicon layer 32 are dissolved and reacted with each other. However, due to the insufficiency of solubility, aluminum precipitates with variant sizes remain on the polysilicon layer 32 and the silicon dioxide layer 31. Referring to FIG. 2, the non-reacted aluminum 33 is etched away by aqua regia solution (one part of nitric acid mixed with three parts of hydrochloric acid) until the silicon dioxide layer 31 is exposed. This results in forming a plurality of silicon nodules 320 of sizes between 500 Å to 5000 Å.

Referring to FIG. 3, using the silicon nodules 320 as masks, the silicon dioxide layer 31 is etched by a reactive ion etching (RIE) process to form a plurality of oxide islands 310 with sizes of between 500 Å to 5000 Å. Then, another etching step is performed by using the oxide islands 310 as masks to remove the silicon nodules 320 as well as etch the polysilicon layer 24 to a predetermined depth, thereby forming a plurality of polysilicon pillars to provide a rugged surface. After that, as shown in FIG. 4, the oxide islands 310 is removed by dipping the substrate in hydrofluoric acid (HF) solution, completing the fabrication of a storage plate of a capacitor.

However, the above method is not effective in mass production since it needs complicated processing steps to form the bristle-shaped storage plate. In addition, the size of each silicon nodules can not be controlled accurately, because they are formed utilizing the insufficiency of solubility between aluminum and polysilicon.

SUMMARY OF THE INVENTION

It is therefore an object of the present invention to provide a method of fabricating a storage plate of a semiconductor capacitor to maintain the desired capacitance as the horizontal dimension of the semiconductor capacitor is decreased.

It is another object of the present invention to provide a method for fabricating a storage plate of a semiconductor capacitor, which can solve the problems known in the above-mentioned prior art.

In accordance with a first aspect of the present invention, a method for fabricating a storage plate of a semiconductor capacitor is provided. First, a conductive layer is formed on a semiconductor substrate. A glue layer is formed on the conductive layer. A plurality of micro masking-balls are then spread onto the surface of the glue layer. Using these micro masking-balls as masks, the glue layer is etched to expose a portion of the conductive layer surface. Using the remaining glue layer as a mask, the conductive layer is etched to form a bristle-shaped conductive layer. After that, the glue layer and micro masking-balls are removed, wherein the remaining bristle-shaped conductive layer forms a storage plate of a semiconductor capacitor.

In accordance with a second aspect of the present invention, a method for fabricating a storage plate of a semiconductor capacitor is provided. A conductive layer, an insulating layer, a glue layer are successively formed on a semiconductor substrate. A plurality of micro masking-balls are then spread onto the surface of the glue layer. Using these micro masking-balls as masks, the glue layer is anisotropically etched to expose a portion surface of the insulating layer. Using the remaining glue layer as a mask, the insulating layer is anisotropically etched to expose a portion surface of the conductive layer. Once more, using the remaining insulating layer as a mask, the conductive layer is anisotropically etched to a predetermined depth. Finally, a wet etching process is performed to remove the insulating layer as well as the glue layer and the micro masking-balls in a lift-off manner, thereby the remaining conductive layer constructs a storage plate of a semiconductor capacitor.

According to a preferred embodiment of the present invention, each of the micro masking balls has a diameter of between 30 Å to 2000 Å. In addition, the micro masking balls are made of a material selected from the group of silicon (Si), silica, silicon dioxide ($SiO_2$), silicon carbide ($SiC_x$), aluminum oxide ($Al_2O_3$), tantalum oxide ($Ta_2O_5$), titanium oxide (TiO2), silicon nitride ($Si_3N_4$), and caged olefins $C_n$(n>60).

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENTS

Embodiment 1

Figure 1:
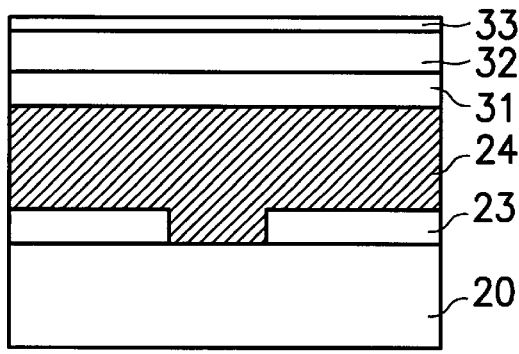
FIGS. 1 to 4 are cross-sectional diagrams illustrating the process flow of a conventional method for fabricating a storage plate of a semiconductor capacitor.
Figure 2:
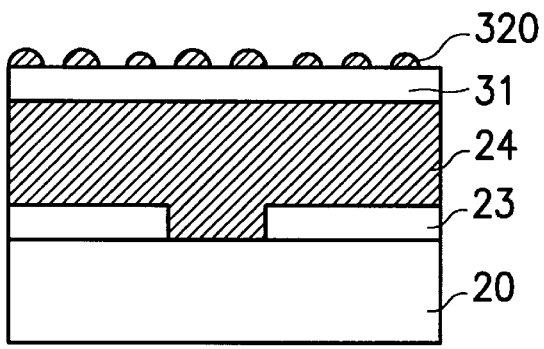
Figure 3:
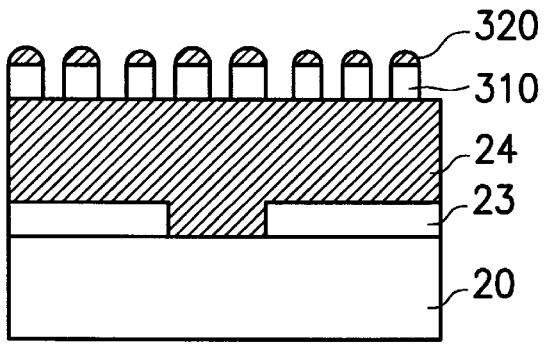
Figure 4:
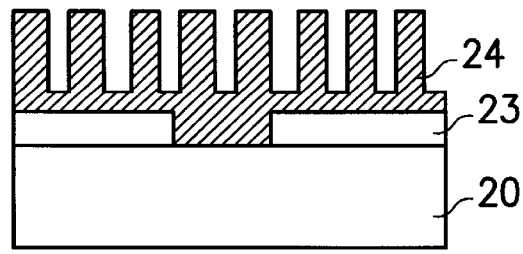
Figure 5A:
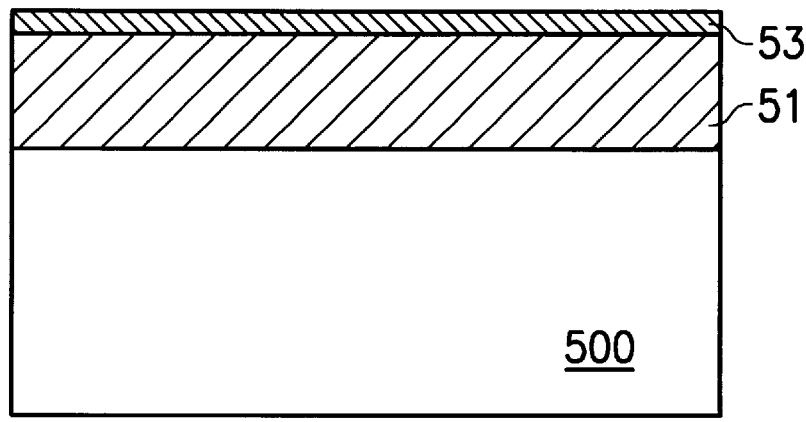
FIGS. 5A to 5H are cross-sectional diagrams of a semiconductor substrate illustrating the process flow of a first preferred embodiment according to the present invention.

FIG. 5A depicts the initial stage of a fabricating process according to a first embodiment of the present invention, including the steps of forming a conductive layer 51 and a glue layer 53 on a substrate 500. As shown in the drawing, the substrate 500 is made of a semiconductor material, such as silicon (Si), germanium (Ga), or gallium-arsenide (GaAs). Several methods can be used to for the substrate 500, such as epitaxial or silicon-on-insulator techniques. In the present embodiment, a P-type silicon substrate is provided as the substrate 500.

In the initial stage of fabrication, a conductive layer is first formed on the substrate 500. For example, a low-pressure chemical vapor deposition (LPCVD) process is performed by using silicane (SiH4) as a reaction material, to form a polysilicon layer 51 with a thickness of between 2000 Å to 8000 Å. In order to improve the conductivity of the conductive layer 51, an appropriate amount of arsenic (As) or phosphorous (P) ions is incorporated into the conductive layer 51 by diffusion, implantation, or in-situ doped processes. A glue layer 53 is then formed on the conductive layer 51. A physical vapor deposition (PVD) or a CVD process can be used to form such a glue layer 53. For example, a magnetron DC sputtering process is performed to form a layer of titanium (Ti) or chromium (Cr) with a thickness of about 500 Å.

Figure 5B:
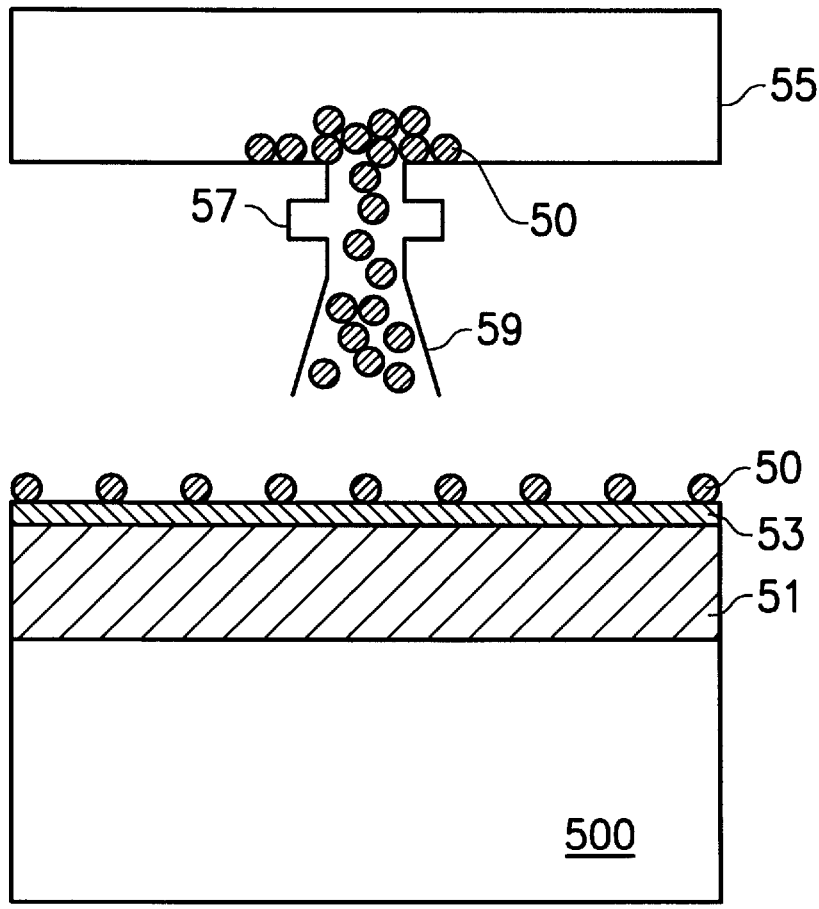
Figure 5B:
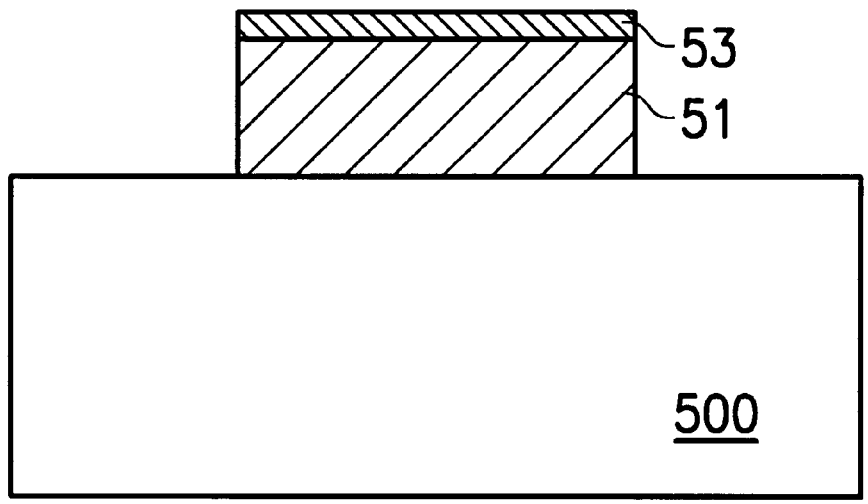

FIG. 5B depicts further steps of the fabrication process on the substrate of FIG. 5A, including the steps of spreading micro masking balls 50 onto the surface of the glue layer 53. For example, the micro masking balls 50 are "spacers" normally used in the liquid crystal display (LCD) manufacturing process. The micro masking balls 50 are stored in a spread machine 55 and then are spread through a nozzle 59 onto the surface of the glue layer 53, in either a dry or a wet scheme. For a dry scheme, isopropyl alcohol (IPA) is added to the spread machine 55 as a volatile solvent. For a wet scheme, isopropyl alcohol (IPA) and water are added to the spread machine 55 as a volatile solvent. In any case, an ionization instrument 57 can be engaged to the spread machine 55 to ionize the micro masking balls 50. Therefore, if a electrical field is applied to the substrate 500, the micro masking balls 55 can be spread uniformly and adhere tightly to the surface of the glue layer 53.

In this embodiment, the material of micro masking balls can be silicon (Si), silica, silicon dioxide ($SiO_2$), silicon carbide ($SiC_x$), aluminum oxide ($Al_2O_3$), tantalum oxide ($Ta_2O_5$), titanium oxide (TiO2), silicon nitride ($Si_3N_4$), or caged olefins $C_n$ (n>60). Each of the micro masking balls has a diameter of between 30 Å to 2000 Å. Furthermore, to improve the adhesion between the micro masking balls 50 and the glue layer 53, an optional annealing step can be performed at an appropriate temperature.

Figure 5C:
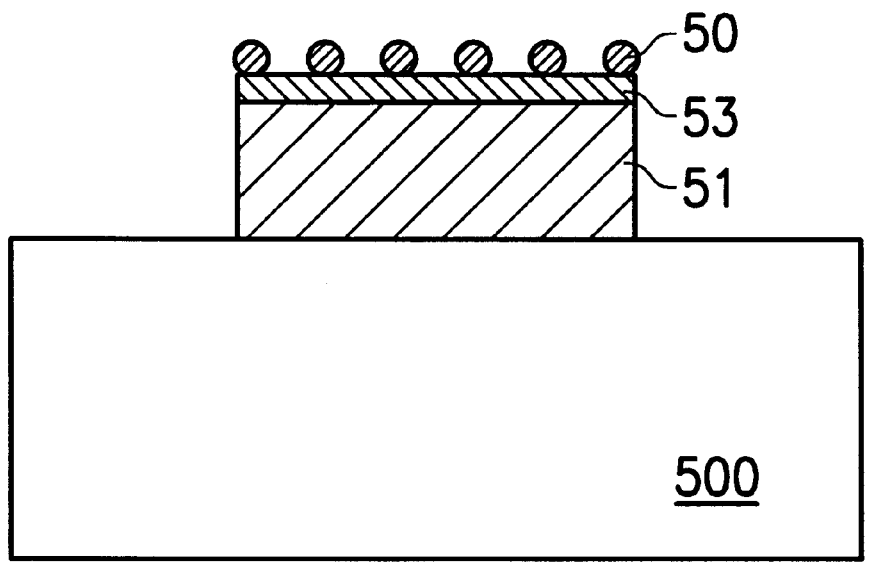

Next, the conductive layer 51 and the glue layer 53 are patterned by conventional photolithography and etching processes, thereby defining the margin of a storage plate shown in FIG. 5C. However, the above processing steps are exchangeable. For example, referring to FIG. 5B', the glue layer 53 and the conductive layer 51 are first patterned by conventional photolithography and etching processes. After defining the margin of a storage plate, the micro masking balls are spread onto the surface of the remaining glue layer 53. This also results in the structure illustrated in FIG. 5C.

Figure 5D:
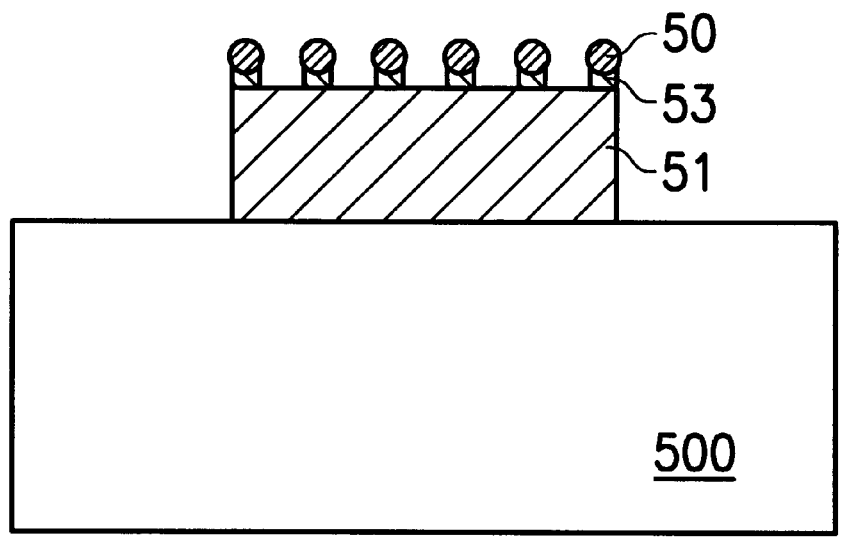

FIG. 5D depicts further steps of the fabrication process on the substrate of FIG. 5C, including the steps of etching the glue layer 53 by using the micro masking balls 50 as masks. For example, a reactive ion etching (RIE) process is performed by using $BCl_3/Cl_2$ or $CCl_4$ as the reaction agent, so as to anisotropically etch the glue layer 53(e.g. a titanium layer) to expose a portion surface of the conductive layer 51.

Figure 5E:
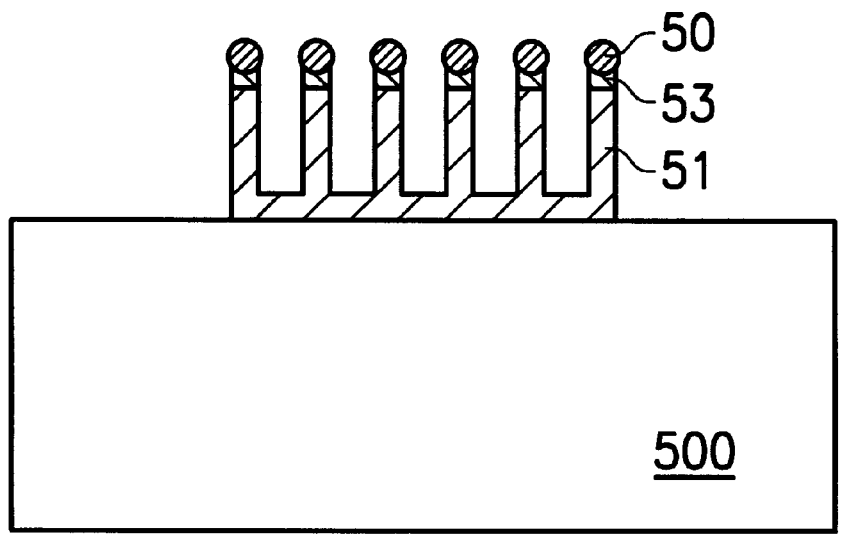

FIG. 5E depicts further steps of the fabrication process on the substrate of FIG. 5D, including the steps of etching the conductive layer 51 by using the remaining glue layer 53 as a mask. For example, a reactive ion etching (RIE) process is performed by using $Cl_2$, HCl, or $SiCl_2$ as the reaction agent, so as to anisotropically etch the conductive layer 51 (e.g. a polysilicon layer) until a thickness of about 1000 Å remains.

Figure 5F:
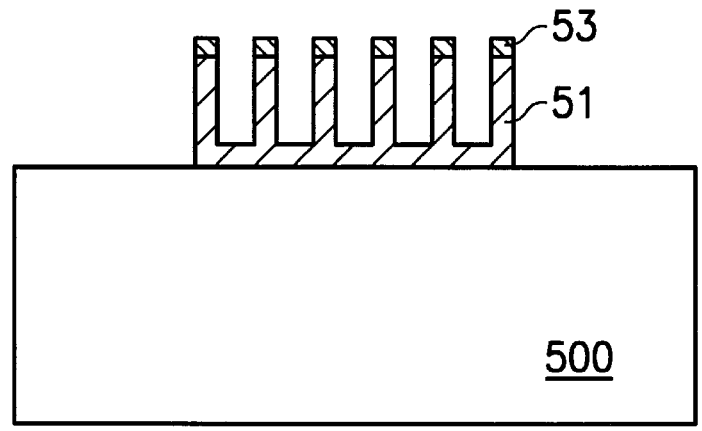
Figure 5G:
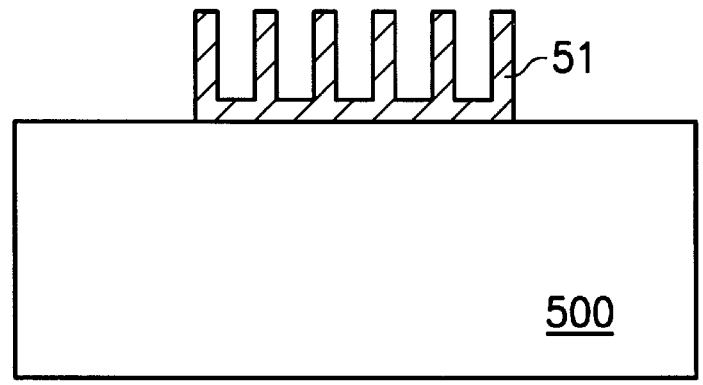

FIG. 5F and FIG. 5G each depict further steps of fabrication process on the substrate of FIG. 5E, including the steps of removing the micro masking balls 50 and the remaining glue layer 53, respectively. If the micro masking balls 50 are made of silicon dioxide or silicon nitride, a dry etching process, for example, a reactive ion etching (RIE) process using $CHF_3$ as the reaction agent is performed to remove the micro masking balls 50. After that, another dry etching process, for example, a reactive ion etching (RIE) process using $BCl_3/Cl_2$ or $CCl_4$ as the reaction agent is performed to remove the remaining glue layer 53. Thus, the remaining bristle-shaped conductive layer 51 forms a storage plate of a semiconductor capacitor, as shown in FIG. 5G.

Figure 5H:
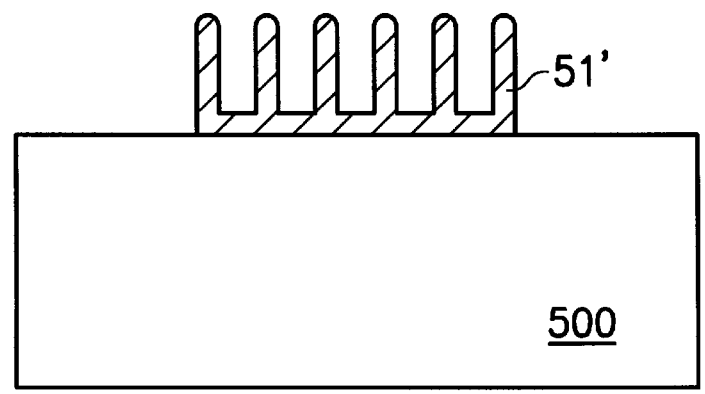

Referring to FIG. 5H, an optional corner round-off etching step is performed. Because the corner of the bristle-shaped conductive layer 51 shown in FIG. 5G is sharp, a charge accumulation effect usually occurs. Therefore, a wet etching using a mixture of nitric acid ($HNO_3$) and hydrofluoric acid (HF) as the etchant is performed to treat the corner of the bristle-shaped conductive layer 51.

The micro masking balls 51 and the glue layer 53 can be removed concurrently by a wet etching process. For example, an ammonia water is used to etch away the glue layer 53. In the mean time, the micro masking balls 50 are removed in a lift-off manner as well. After that, the optional corner round-off etching step is performed to treat the bristle-shaped conductive layer 51.

Embodiment 2

The etching selectivity ratio of the glue layer 53 to the micro masking balls 50 will be reduced if the diameter of each of the micro masking balls 50 is less than 1000 Å. This results in poor pattern transference in the succeeding process. Therefore, another embodiment that can prevent this problem is now described with reference to FIGS. 6A to 6E.

Figure 6A:
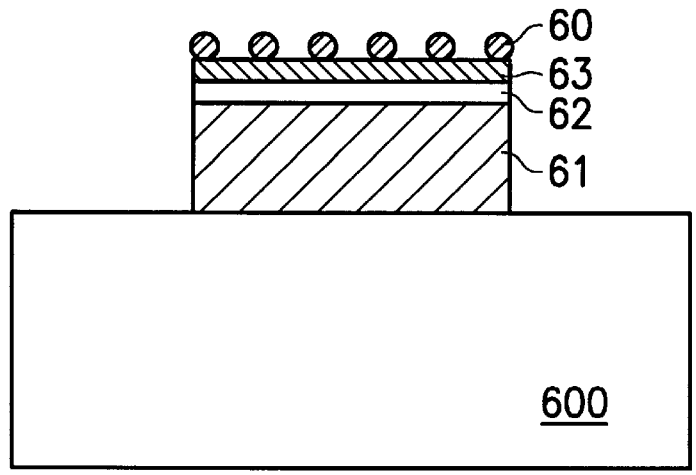
FIGS. 6A to 6E are cross-sectional diagrams of a semiconductor substrate illustrating the process flow of a second preferred embodiment according to the present invention.

FIG. 6A depicts the initial stage of a fabrication process according to a second embodiment of the present invention, including the steps of forming a conductive layer 61, an insulating layer 62, and a glue layer 63 on a substrate 500. The processes of forming the conductive layer 61 and the glue layer 63 are the same as those depicted in the first embodiment. The purpose of forming the insulating layer 62 between the conductive layer 61 and the glue layer 63 is to improve the pattern transference in the succeeding process. The insulating layer 62 may be a silicon dioxide layer made by thermal oxidation or CVD. For example, a low-pressure chemical vapor deposition (LPCVD) process is performed by using tetraethyl-orthosilicate (TEOS) as a reaction material to form a silicon dioxide layer 62. Then, a dry or wet spreading method is utilized to spread micro masking balls 60 onto the surface of the glue layer 63.

Figure 6B:
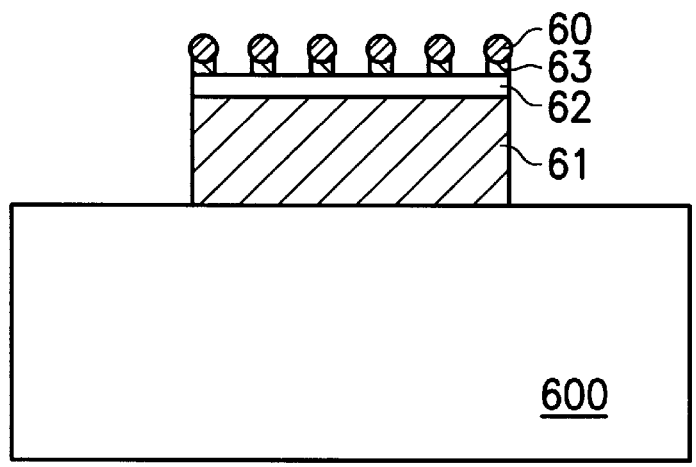

FIG. 6B depicts further steps of the fabrication process on the substrate of FIG. 6A, including the steps of etching the glue layer 63 by using the micro masking balls 60 as masks. For example, a reactive ion etching (RIE) process is performed by using $BCl_3/Cl_2$ or $CCl_4$ as the reaction agent, so as to anisotropically etch the glue layer 63 (e.g. a titanium layer) to expose a portion surface of the insulating layer 62. Due to the distinct etching selectivity ratio of the glue layer 63 to the insulating layer, the pattern transference in the succeeding process can be maintained in a good condition.

Figure 6C:
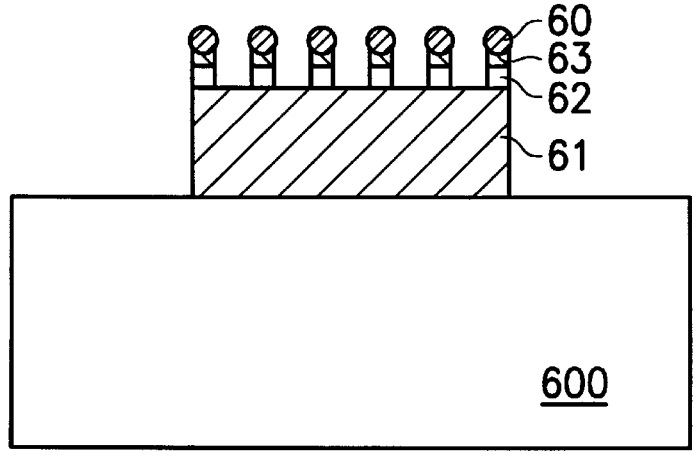

FIG. 6C depicts further steps of the fabrication process on the substrate of FIG. 6B, including the steps of etching the insulating layer 62 by using the remaining glue layer 63 as a mask. For example, a reactive ion etching (RIE) process is performed by using $CHF_3$ as the reaction agent, so as to anisotropically etch the silicon dioxide layer 62 to expose a portion surface of the conductive layer 61.

Figure 6D:
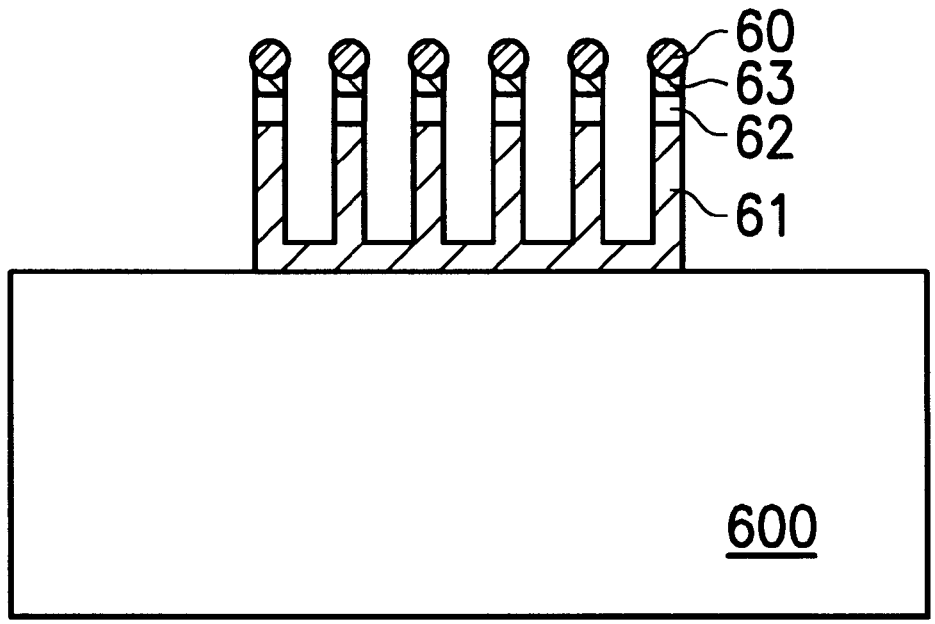

FIG. 6D depicts further steps of the fabrication process on the substrate of FIG. 6C, including the steps of etching the conductive layer 61 by using the remaining insulating layer 62 as a mask. For example, a reactive ion etching (RIE) process is performed by using $Cl_2$, HCl, or $SiCl_2$ as the reaction agent, so as to anisotropically etch the conductive layer 61 (e.g. a polysilicon layer) until a thickness of about 1000 Å remains.

Figure 6E:
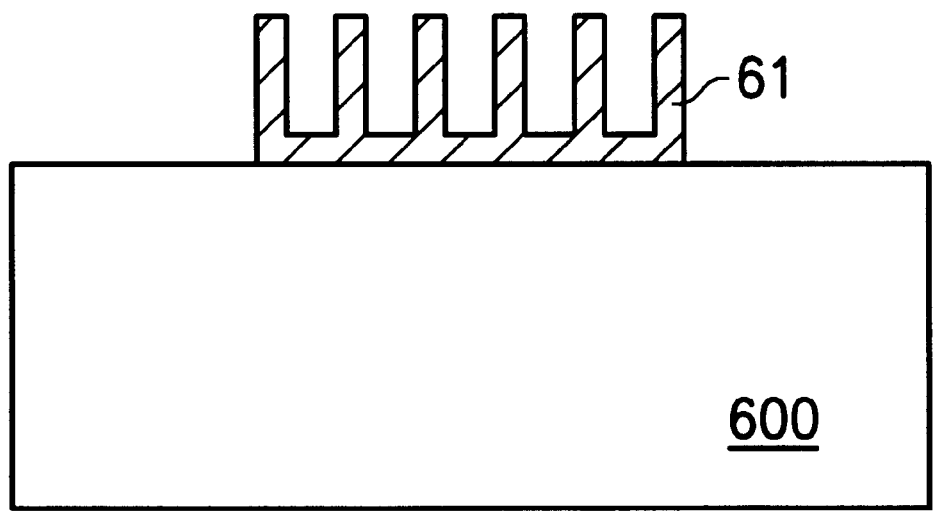

FIG. 6E depicts further steps of the fabrication process on the substrate of FIG. 6D, including the steps of removing the micro masking balls 60, the insulating layer 62, and the glue layer 63. For example, a wet etching process using a mixture of hydrofluoric acid and a buffered agent such as aminodifluoride ($NHF_2$) is performed to remove the silicon dioxide layer 62. In the mean time, the glue layer 63 and the micro masking balls 50 are removed in a lift-off manner as well. After that, the remaining bristle-shaped conductive layer 61 forms a storage plate of a semiconductor capacitor. To prevent the charge accumulation effect, an optional corner round-off etching step is then performed to treat the bristle-shaped conductive layer 61.

Figure 7:
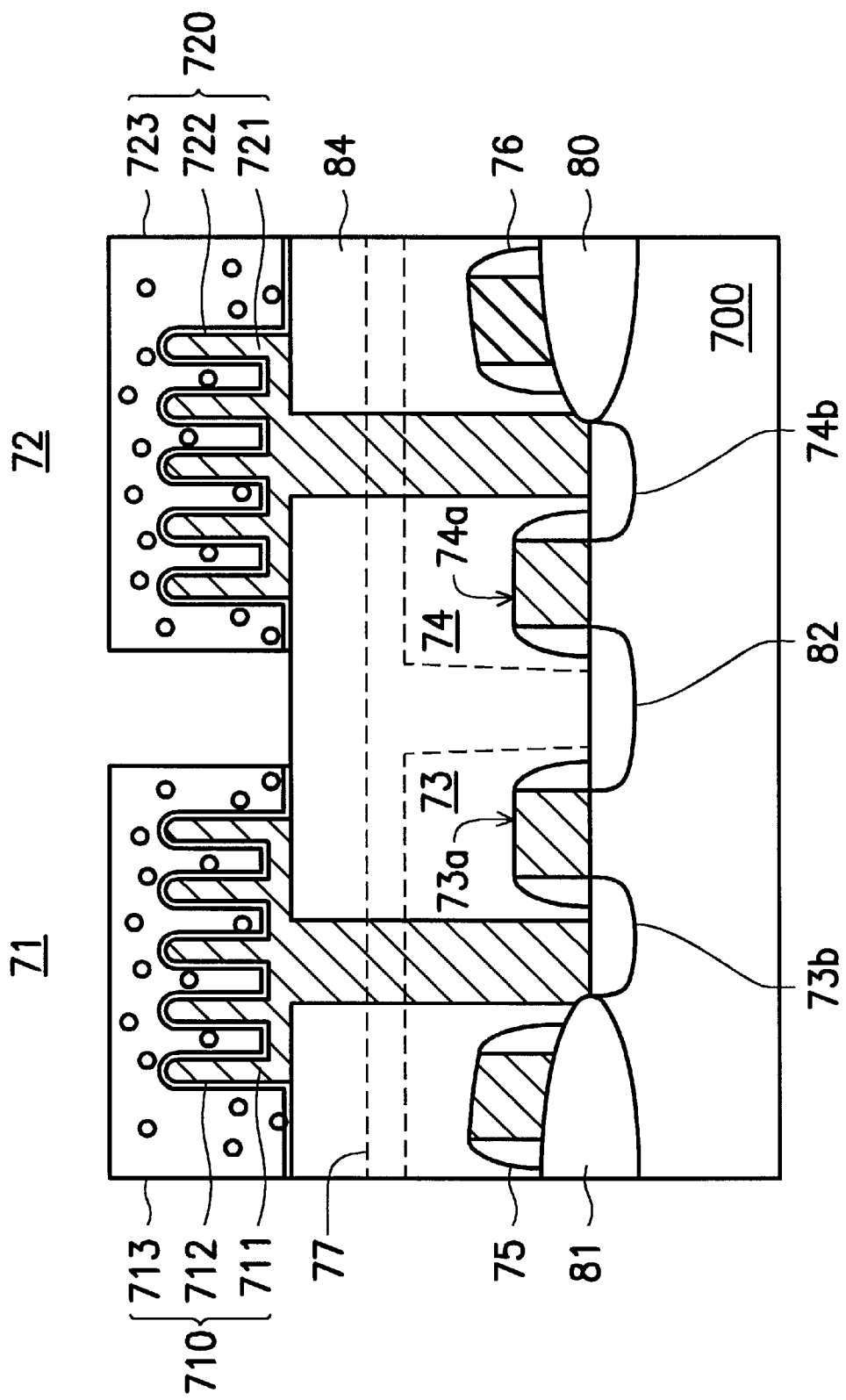
FIG. 7 is a cross-sectional view of DRAM cells with capacitors having a bristle-shaped storage plate fabricated by the method according to the present invention.

The storage plates fabricated in the first and second embodiments can be used in a semiconductor memory device, such as a dynamic random access memory (DRAM). FIG. 7 shows a cross-sectional view of DRAM cells 71 and 72 with capacitors having a bristle-shaped storage plate fabricated by either the first or the second embodiments according to the present invention.

First, a semiconductor substrate 700 having transistors 73 and 74 is provided. For example, a local oxidation of silicon (LOCOS) process is conducted to form a field insulator 80, 81 with a thickness of about 5000 Å, thereby defining the active area of the semiconductor substrate 700. Transistors 73, 74 are then fabricated on the active area by conventional deposition, photolithography, etching, and implantation processes. The transistor 73 includes a gate 73a, a source region 73b, and a drain region 82. The transistor 74 includes a gate 74a, a source region 74b, and the drain region 82.

A first insulating layer and a bit-line 77 are formed on the transistor 73, 74 successively. The bit-line 77 is connected to the common drain region 82 through a contact window of a first insulating layer. Please note that the bit-line 77 is illustrated by a dashed line since it is located at a cross section other than the one of this drawing. After that, another insulating layer 84 such as a borophosphosilicate glass (BPSG) layer is deposited overlying the entire substrate. For example, an air-pressure chemical vapor deposition (APCVD) using tetraethyl-orthosilicate (TEOS), $O_3/O_2$, triethyl-borate (TEB), and trimethyl-phosphate (TMP) as reaction materials to form a BPSG layer with a thickness of about 5000 Å. Appropriate photolithography and etching processes are then performed to form contact windows in the insulating layer 84. The contact windows expose the source regions 73b and 74b.

Next, the processing steps described in either the first or the second embodiments are preformed to fabricate storage plates 711 and 721. Dielectric layers 712 and 722 are formed on the surfaces of the storage plates 711 and 721 respectively. The dielectric layers 712 and 722 can be any materials with a high dielectric constant, such as oxide/nitride/oxide (O/N/O) stacked layers or a tantalum oxide ($Ta_2O_5$) layer. Finally, conductive layers 713 and 723 are formed on the surfaces of the dielectric layers 712 and 722 respectively. For example, a lowpressure chemical vapor deposition (LPCVD) process using silicane ($SiH_4$) as reaction material is performed to form a polysilicon layer with a thickness of about 2000 Å. The polysilicon layer is then patterned by conventional photolithography and etching processes to form the conductive layers 713 and 723. In order to improve the conductivity of the conductive layers 713 and 723, an appropriate amount of arsenic (As) or phosphorous (P) ions is incorporated into the conductive layer 51 by diffusion, implantation, or in-situ doped processes. Accordingly, the storage plate 711, the dielectric layer 712, and the conductive layer 713 together form a capacitor 710. The storage plate 721, the dielectric layer 722, and the conductive layer 723 together form another capacitor 720. The capacitors 710 and 720 combined with the transistors 73 and 74 then form the DRAM cells 71 and 72 respectively.

Obviously, the storage plate of the present invention can fulfill the requirement of the next-generation integrated circuit fabrication since the bristle-shaped structure can provide sufficient capacitance for a shrunk device. For those skilled in the art, the characteristics of the preferred embodiments could be used individually or simultaneously, to build different kinds of semiconductor capacitors. Any suitable substitutions of material or variations in structure of the storage plate are permissible.

While the invention has been described by way of example and in terms of preferred embodiment, it is to be understood that the invention is not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for fabricating a storage plate of a semiconductor capacitor, comprising the steps of:
   (a) providing a semiconductor substrate;
   (b) forming a conductor layer on said semiconductor substrate;
   (c) forming a glue layer on said conductor layer;
   (d) providing a plurality of micro masking-balls in a solid state onto the surface of said glue layer by spread means;
   (e) etching said glue layer by using said plurality of micro masking-balls as masks until the surface of said conductive layer is exposed;
   (f) etching said conductive layer to form a brisle-shaped conductor layer; and
   (g) removing said glue layer and said plurality of micro masking-balls, wherein the remaining bristle-shaped conductor forms a storage plate of a semiconductor capacitor.

2. A method for fabricating a storage plate of a semiconductor capacitor according to claim 1, wherein said semiconductor substrate includes a transistor device having a diffusion region.

3. A method for fabricating a storage plate of a semiconductor capacitor according to claim 2, wherein said diffusion region is an N-type doping region.

4. A method for fabricating a storage plate of a semiconductor capacitor according to claim 2, wherein the step (a) further comprises:
   forming an insulating layer on the surface of said semiconductor substrate; and
   patterning said insulating layer to form a contact window for exposing a portion of said diffusion region.

5. A method for fabricating a storage plate of a semiconductor capacitor according to claim 4, wherein the step (b) comprises:
   depositing a conductive layer to fill said contact window and cover the surface of said insulating layer; and
   selectively etching said conductive layer to define the margin of a storage plate.

6. A method for fabricating a storage plate of a semiconductor capacitor according to claim 5, wherein said insulating layer is a silicon dioxide layer.

7. A method for fabricating a storage plate of a semiconductor capacitor according to claim 1, wherein said glue layer is made of titanium or chromium.

8. A method for fabricating a storage plate of a semiconductor capacitor according to claim 1, wherein said plurality of micro masking-balls are made of a material selected from the group of silicon (Si), silica, silicon dioxide ($SiO_2$), silicon carbide ($SiC_x$), aluminum oxide ($Al_2O_3$), tantalum oxide ($Ta_2O_5$), titanium oxide (TiO2), silicon nitride ($Si_3N_4$), and caged olefins $C_n$(n>60).

9. A method for fabricating a storage plate of a semiconductor capacitor according to claim 8, wherein each of said plurality of micro masking-balls has a diameter of between 30 Å to 2000 Å.

10. A method for fabricating a storage plate of a semiconductor capacitor according to claim 1, further comprising a step of corner round-off etching said bristle-shaped conductive layer.

11. A method for fabricating a storage plate of a semiconductor capacitor, comprising the steps of:
    (a) providing a semiconductor substrate;
    (b) forming a conductive layer on said semiconductor substrate;
    (c) forming an insulating layer on said conductive layer;
    (d) forming a glue layer on said conductive layer;
    (e) providing a plurality of micro masking-balls in a solid state onto the surface of said glue layer by spread means;
    (f) anisotropically etching said glue layer by using said plurality of micro masking-balls until the surface of said insulating layer is exposed;
    (g) anisotropically etching said insulating layer until exposing the surface of said conductive layer;
    (h) anisotropically etching said conductive layer to longitudinally remove a portion, but not all, of the conductive layer by using said insulating layer as a mask; and
    (i) performing a wet etching process to remove said insulating layer as well as to remove said glue layer and said plurality of micro masking-balls in a lift-off manner, wherein the remaining conductive layer constructs a storage plate of a semiconductor capacitor.

12. A method for fabricating a storage plate of a semiconductor capacitor according to claim 11, wherein each of said plurality of micro masking-balls has a diameter of between 30 Å to 1000 Å.

13. A method for fabricating a storage plate of a semiconductor capacitor according to claim 11, wherein said insulating layer is a silicon dioxide layer.

14. A method for fabricating a storage plate of a semiconductor capacitor according to claim 11, wherein said wet etching process is performed in a mixture of hydrogen fluoride (HF) and a buffered agent.

15. A method for fabricating a storage plate of a semiconductor capacitor according to claim 14, wherein said buffered agent is aminodifluoride ($NHF_2$).

16. A method of claim 11, wherein the steps of anisotropically etching said conductor layer is performed until said conductor layer has a thickness of about 1000 Å.

17. A method for fabricating a semiconductor capacitor, comprising the steps of:
    (a) providing a semiconductor substrate including a transistor device having a diffusion region;
    (b) forming an insulating layer on the surface of said semiconductor substrate;
    (c) patterning said insulating layer to form a contact window for exposing a portion of said diffusion region;
    (d) forming a first conductive layer to fill said contact window and cover the surface of said insulating layer;
    (e) forming a titanium layer on said first conductive layer;
    (f) providing a plurality of micro masking-balls in a solid state onto the surface of said titanium layer by spread means;
    (g) anisotropically etching said titanium layer by using said plurality of micro masking-balls as masks until the surface of said first conductive layer is exposed;
    (h) anisotropically etching said first conductive layer to longitudinal remove a portion, but not all, of the conductive layer by using said titanium layer as a mask;
    (i) removing said titanium layer and said plurality of micro masking-balls, wherein the remaining first conductive layer forms a lower storage plate of a semiconductor capacitor;

(j) forming a dielectric layer on said lower storage plate; and (k) forming a second conductive layer on said dielectric layer as an upper storage plate of the semiconductor capacitor.

18. A method for fabricating a semiconductor capacitor according to claim 17, wherein said diffusion region of said transistor device is a source doping region.

19. A method for fabricating a semiconductor capacitor according to claim 18, wherein said transistor device further includes a drain doping region.

20. A method for fabricating a semiconductor capacitor according to claim 9 wherein said drain doping region is connected to a bit-line.

21. A method for fabricating a semiconductor capacitor according to claim 7, wherein said plurality of micro masking-balls is subjected to an ionization process.

22. The method of claim 7, wherein the step of anisotropically etching said first conductive layer is performed until said first conductive layer has a thickness of about 1000 Å.

* * * * *